METHOD AND APPARATUS FOR ASSEMBLING ELECTRICAL COMPONENTS ON PRINTED WIRING CARDS
Filed Oct. 11, 1957

United States Patent Office 2,959,848
Patented Nov. 15, 1960

2,959,848

METHOD AND APPARATUS FOR ASSEMBLING ELECTRICAL COMPONENTS ON PRINTED WIRING CARDS

Arnold J. Savitt, Bronx, N.Y., assignor to Hazeltine Research, Inc., Chicago, Ill., a corporation of Illinois Filed Oct. 11, 1957, Ser. No. 689,671

8 Claims. (Cl. 29—407)

This invention relates, in general, to a method and apparatus for assembling electrical components on a printed wiring card and, more specifically, to a method and apparatus which makes use of a visible code as a guide in the manual assembly of electrical components to a printed wiring card having numerous holes, selected ones of which are to receive the leads of the components.

An object of this invention is to provide a new and improved, simply constructed apparatus and inexpensive method for assembling electrical components on such a printed wiring card by using a visibly coded chart as a guide during assembly.

It is a further object of this invention to provide such a method and apparatus enabling rapid and accurate manual assembly of a plurality of printed wiring cards as would be necessary in a relatively small scale production line.

In accordance with the invention, a method of assembling electrical components in selected holes of a plurality of holes in a printed wiring card comprises aligning with the card a coded chart with visible code indicia which aligns with the selected holes to indicate the same and inserting the leads of electrical components into the holes so indicated.

For a better understanding of the present invention, together with other and further objects thereof, reference is had to the following description taken in connection with the accompanying drawing, and its scope will be pointed out in the appended claims.

Referring to the drawing.

Figure 1:
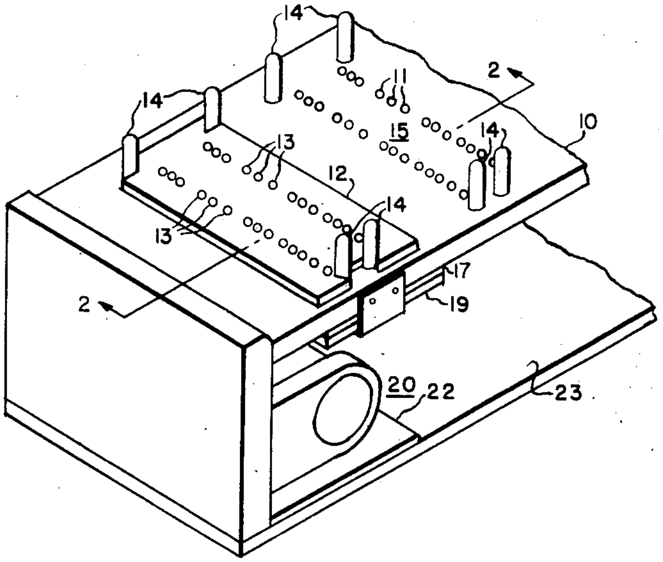
Fig. 1 is a perspective view of card assembly apparatus constructed in accordance with a preferred embodiment of the invention.
Figure 2:
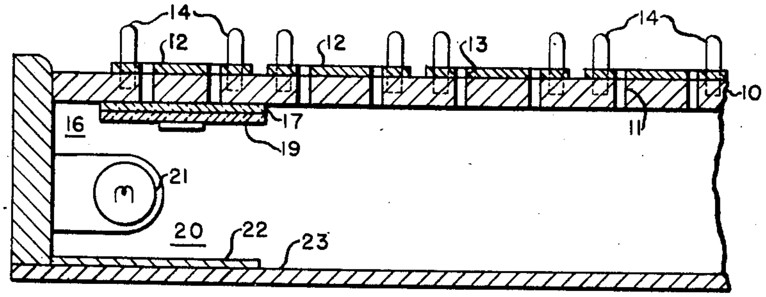
Fig. 2 is a cutaway side view of the apparatus of Fig. 1.

Referring to Figs. 1 and 2 of the drawing, there is shown a representative embodiment of a printed wiring card assembly apparatus constructed according to the present invention. The apparatus includes a platform means 10 having a plurality of holes 11 extending through the platform means 10. On the platform means 10 is positioned a printed wiring card 12 oriented and held in place by alignment means comprising pins 14, 14. When placed in this position, mounting holes 13 in the printed wiring card 12 are in alignment with the holes 11 in the platform means. These holes 11 are further arranged in groups 15 and, with their corresponding alignment means 14, are spaced along the platform means 10 so that a plurality of cards 12 may be placed thereon in single layer fashion.

Figure 3:
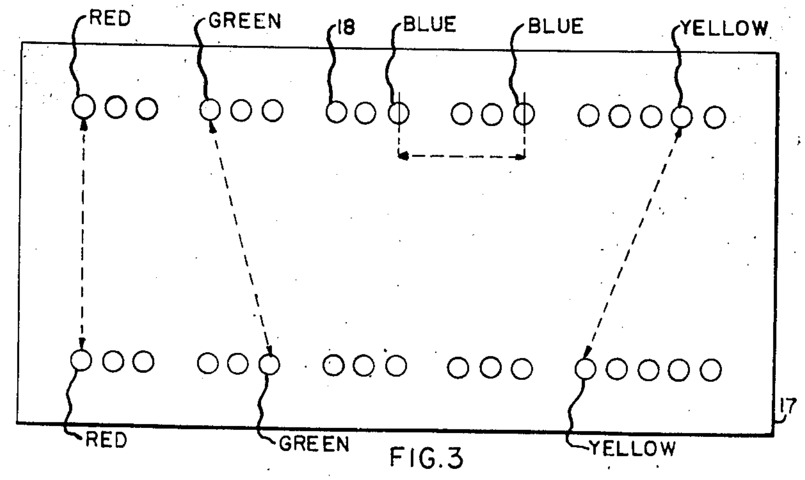
Fig. 3 is a top view of the color-coded guide means showing the use of the color code thereon.

The apparatus further includes a means 16 for positioning a visibly-coded chart 17 in place adjacent and beneath the platform means 10 by a nonopaque holding means, for example, comprising a transparent plate 19. As represented in Fig. 3, color-coded indicia 18 are printed or placed by some similar means on the color-coded chart 17 such that the indicia will align with the selected mounting holes 13 in the printed wiring card 12 and so indicate the selected holes.

Referring again to Figs. 1 and 2, the apparatus may further include an illuminating means 20 having a light source 21 mounted directly beneath the guide means 16 on a base piece 23. The base piece 23 has a top surface of a reflective material 22.

In operation, a printed wiring card 12 is placed on the platform 10 over the groups of holes as oriented by the alignment means 14. Similarly, other cards are placed on the platform as shown in Fig. 2.

A color-coded chart 17 is inserted between the holding plate 19 and the platform 10 such that the color code 18 is visible through the selected mounting holes 13, the light 21 being on at the present.

Assume, as an example, that the color code chosen has the following significance:

Red—component lies perpendicular to the long edge on the card;

Green—component lies diagonal from the upper left to lower right on the card;

Yellow—component lies diagonal from the upper right to lower left on the card;

Blue—component lies parallel to the long edge on the card.

Referring to Fig. 3, an illustration of this code is seen. It is to be understood that in operation the dotted lines would not be on the chart 17.

The operator, having readily memorized this code, would look through the mounting holes 13 and see at a glance into which holes to insert the electrical component leads. After having used the color-coded guide 16 to assemble the first card 12, the remaining cards on the platform 10 could be assembled using the first card 12 as a guide.

From the foregoing description of the invention it can be plainly seen that errors in the manual assembly of the printed card have been substantially eliminated by keeping the operator's attention focused on the card during assembly and thus avoiding the tedious constant referral to a schematic or print to determine the proper location of the mounting holes as required. Also, another source of error, that of counting along the holes to determine the selected holes in which to insert the component leads has been eliminated. Thus, the invention provides a rapid and accurate apparatus and method for assembly.

While there has been described what is at present considered to be the preferred embodiment of this invention, it will be obvious to those skilled in the art that various changes and modifications may be made therein without departing from the invention, and it is, therefore aimed to cover all such changes and modifications as fall within the true spirit and scope of the invention.

What is claimed is:

1. The method of assembling electrical components in selected holes of a plurality of holes in a printed wiring card comprising: aligning with the card a coded chart with visible code indicia which align with said selected holes to indicate the same; and inserting leads of electrical components into the holes so indicated.

2. The method of assembling electrical components in selected holes of a plurality of holes in a printed wiring card comprising: aligning with the card a coded chart with visible colored code indicia which align with said selected holes to indicate the same; and inserting leads of electrical components into the holes so indicated.

3. The method of assembling electrical components in selected holes of a plurality of holes in a printed wiring card comprising: aligning behind the card a coded chart with visible code indicia which align with said selected holes so as to be visible therethrough to indicate the same to a viewer in front of the card; and inserting leads of electrical components into the holes so indicated.

4. The mehod of assembling electrical components in selected holes of a plurality of holes in a printed wiring card comprising: aligning behind the card a coded chart with visible colored code indicia which align with said selected holes so as to be visible therethrough to indicate the same to a viewer in front of the card; and inserting leads of electrical components into the holes so indicated.

5. Apparatus for assembling electrical components in selected holes of a plurality of holes in a printed wiring card comprising: means for positioning such a card; a coded chart with visible code indicia adapted to align with said selected holes in said card to indicate the said selected holes; and means for positioning said chart with respect to said first means for so aligning said indicia.

6. Apparatus for assembling electrical components in selected holes of a plurality of holes in a printed wiring card comprising: means for positioning such a card; a coded chart with visible colored code indicia adapted to align with said selected holes in said card to indicate the said selected holes; and means for positioning said chart with respect to said first means for so aligning said indicia.

7. Apparatus for assembling electrical components in selected holes of a plurality of holes in a printed wiring card comprising: means for positioning such a card; a coded chart with visible code indicia adapted to be aligned with and behind said selected holes in said card so as to be visible therethrough to indicate the said selected holes; and means for positioning said chart with respect to said first means for so aligning said indicia.

8. Apparatus for assembling electrical components in selected holes of a plurality of holes in a printed wiring card comprising: means for positioning such a card; a coded chart with visible colored code indicia aligned with and behind said selected holes in said card so as to be visible therethrough to indicate the said selected holes; and means for positioning said chart with respect to said first means for so aligning said indicia.

References Cited in the file of this patent

UNITED STATES PATENTS

| | | |
|---|---|---|
| 1,738,710 | Jones | Dec. 10, 1929 |
| 2,157,036 | Torkleson | May 2, 1939 |
| 2,246,920 | Kromholz | June 24, 1941 |
| 2,503,130 | Poritz | Apr. 4, 1950 |